(12) United States Patent
Menezes et al.

(10) Patent No.: US 6,498,498 B1
(45) Date of Patent: Dec. 24, 2002

(54) APPARATUS AND METHOD FOR APPLYING RECIPROCITY TO FREQUENCY-DOMAIN NOISE ANALYSIS

(75) Inventors: Noel Menezes, Portland, OR (US); Florentin Dartu, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/891,656

(22) Filed: Jun. 27, 2001

(51) Int. Cl.[7] .......................... G01R 29/26; G06E 17/50
(52) U.S. Cl. ........................ 324/613; 703/14; 703/15; 716/15
(58) Field of Search .................. 324/613; 703/14, 703/15; 716/1, 2, 5, 15

(56) References Cited

U.S. PATENT DOCUMENTS 6,308,304 B1 * 10/2001 Devgan et al. ................ 716/5
6,405,348 B1 * 6/2002 Fallah-Tehrani et al. ....... 716/4

* cited by examiner

*Primary Examiner*—N. Le
*Assistant Examiner*—Amy He
(74) *Attorney, Agent, or Firm*—Antonelli, Terry, Stout, & Kraus, LLP

(57) ABSTRACT

A method and apparatus for frequency domain noise analysis that uses moment matching techniques and reciprocity to provide efficient noise analysis without the need for one analysis per attacker and without resorting to pruning techniques and their concommitant error.

18 Claims, 4 Drawing Sheets

APPARATUS AND METHOD FOR APPLYING RECIPROCITY TO FREQUENCY-DOMAIN NOISE ANALYSIS

BACKGROUND

1. Field

This invention relates to electronic circuit wiring nets, and more specifically to noise analysis for electronic circuit wiring nets.

2. Background

Moment-matching techniques like Asymptotic Waveform Evaluation (AWE) are very popular throughout the industry for calculating delay and noise for the interconnects between gates which dominate our current designs. NoisePad, Cross-Cap, iBEST, TANGO and Primetime, EinsTimer, Global Harmony, and Clarinet are examples of tools that use these current techniques. A common problem in all noise tools (and timing tools that deal with noise push out) is the calculation of the effect of noise at the receiver end of an interconnect (i.e., signal net), especially when there are hundreds of adjacent nets represented as capacitors (also known as attackers) with signals coupling to the interconnect under analysis. Each of these coupling capacitors usually requires a separate analysis of the interconnect to calculate the noise at the receiver. The tools described above use the efficiency of rapid interconnect circuit evaluator (RICE), which is a fast frequency domain circuit analyzer based on the AWE theory, to solve the resulting run time problem. Despite the efficiency of RICE, a problem still exists when the number of attacker is large. As a result, tools resort to a set of pruning techniques to reduce the number of attackers.

FIG. 1 shows a diagram of a typical on-chip net with several neighboring nets that couple to it. Driver 10 sends signals on net 14 to receiver 12. Neighboring nets, e.g., 16–19 (shown as rectangles) may be close to net 14 with their own set of signals. The several attacker nets 16–19 can couple with net 14 under consideration. The exact transition times of the attacker signals cannot be accurately determined because of the effect of coupling on the signal wave shape. Further, the timing windows in which each attacker signal effects the net under consideration cannot be accurately determined because of the uncertainty associated with the delays through the circuitry of the attacker signals.

FIG. 2 shows a schematic diagram of an equivalent circuit for noise modeling. Driver 10 drives signals through net 14 to receiver 12 represented by receiver capacitance 18. Each attacker net is represented by a voltage source 20 and a capacitor 22. The circuit model in FIG. 2 may be used where the transition times of the attacker signals $V_{Si}$ are set to a conservatively low value. The lower the value of the transition time, the higher the noise at the receiver. If the driver of the victim net under consideration is modeled as a grounded resister then the entire equivalent circuit can be treated as an n-port linear system, where ports refer to the nodes and the circuit where the excitation sources, i.e., voltage sources, are attached. Since the timing windows of attacker signals cannot be accurately determined, the worst case noise signal may be assumed where the attacker signals align such that the peaks of the noise signals due to each attacker coincide. This is known as the peak alignment and represents the maximum amplitude signal at the receiver.

Currently, the following procedure is used to determine the worst case noise: (1) for each attacker capacitor, a voltage source is attached with a ramp time equal to the estimated transition time for the attacker; all other attacker capacitors are grounded; and the resulting circuit is analyzed to determine the noise signal at the receiver; (2) the noise signals for each attacker are aligned so that the peaks of the noise signals coincide; and (3) the resulting individual noise signals are added to determine the worst case composite noise signal. However, analyzing the resulting circuit to determine the noise signal at the receiver involves analyzing the entire circuit (with a single excitation though) and is very time consuming.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

Figure 1:
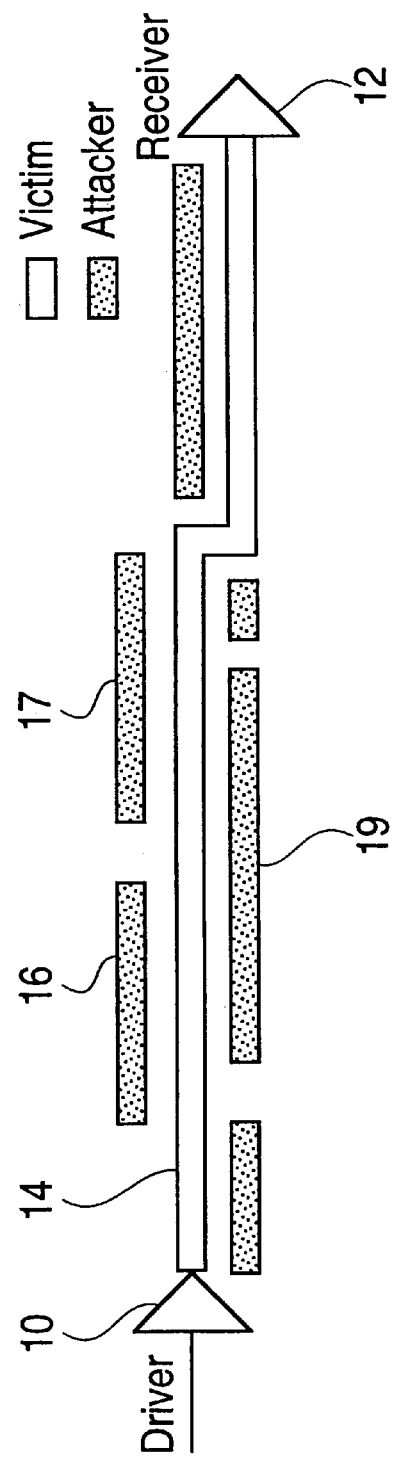
FIG. 1 is a diagram of a typical on-chip net with several neighboring nets that couple to it.

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to method and apparatus for frequency domain noise analysis that uses moment matching techniques and reciprocity to provide efficient noise analysis without the need for one analysis per attacker and without resorting to pruning techniques and their concomitant error.

Circuit analysis for a linear system can be carried out in two domains, the time domain or frequence of the domain. Frequency domain analysis may be significantly faster than time domain analysis. An example of a frequency domain circuit analyzer is RICE which is based on asymptotic wave form evaluation (AWE). AWE theory is based on the fact that low frequency RC circuits do not need to be analyzed over the complete frequency domain but only in part of the frequency domain. Frequency domain analysis is input independent and inherently solves every node in the circuit regardless of the nodes of interest. A frequency domain analyzer computes the transfer function to each node in the net list regardless of the nodes of interest. The principal of reciprocity can be applied to the transfer function generation process to reduce the computational complexity of the process from linear in the number of attacker sources to a single circuit analysis per receiver.

Figure 2:
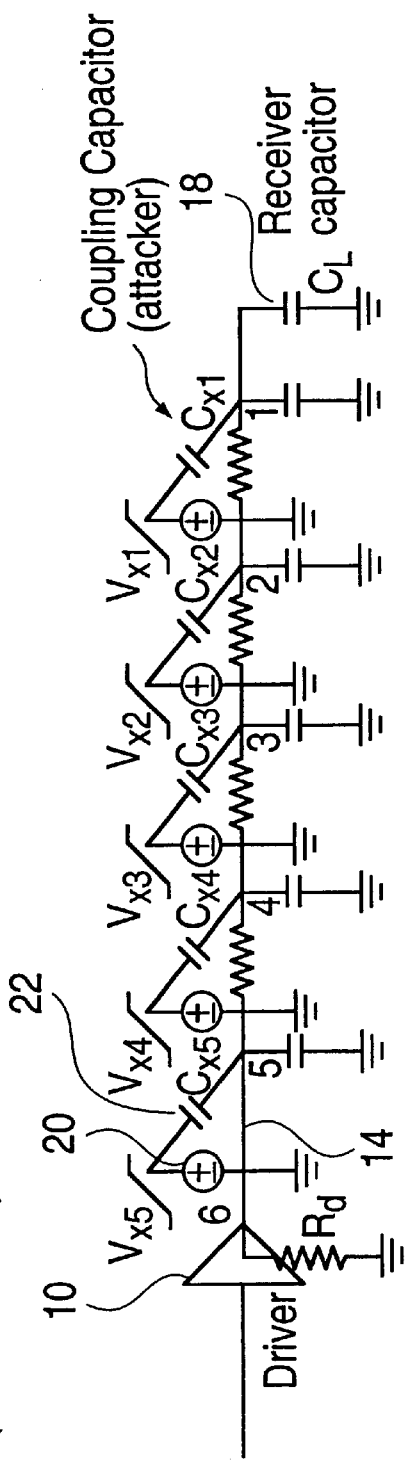
FIG. 2 is a schematic diagram of an equivalent circuit for noise modeling.
Figure 3:
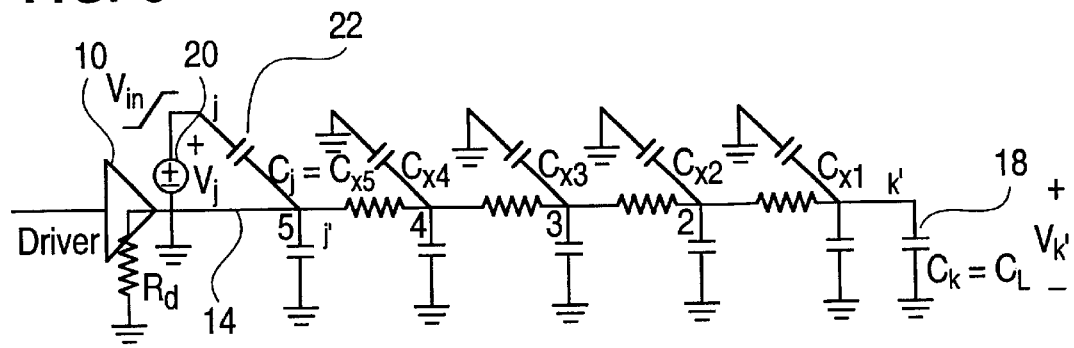
FIG. 3 is a schematic diagram of a circuit used to determine noise at a receiver due to a single attacker according to an example embodiment of the present invention.

FIG. 3 shows a schematic diagram of a circuit used to determine noise at a receiver due to a single attacker according to an example embodiment of the present invention. This circuit is similar to that shown in FIG. 2 except that only one attacker is represented by a voltage source 20 and capacitor 22. Other attackers include a capacitor 12 but the voltage source in FIG. 2 has been grounded in FIG. 3. Therefore, the circuit in FIG. 2 includes 5 ports, whereas the circuit in FIG. 3 has one port. Since it has only one attacker voltage source. As stated previously, a frequency domain analyzer like RICE computes the transfer function to each node in the net list regardless of the nodes of interest. For example, in FIG. 3, this involves computing the transfer function from node 'j' to nodes 2, 3, 4 and 5, as well as to receiver node 'k'.

Therefore, instead of applying a voltage source to each of the attacker sources in turn and calculating the transfer function to the receiver via a frequency domain analysis, some kind of source is attached at the receiver and all the relevant transfer functions to the attacker capacitor nodes obtained in a single frequency domain analysis.

The reciprocity theorem simply stated is that for a reciprocal network, the ratio of the response transform to excitation transform is invariant to an interchange of the position in the network of the excitation and the response.

Figure 4A:
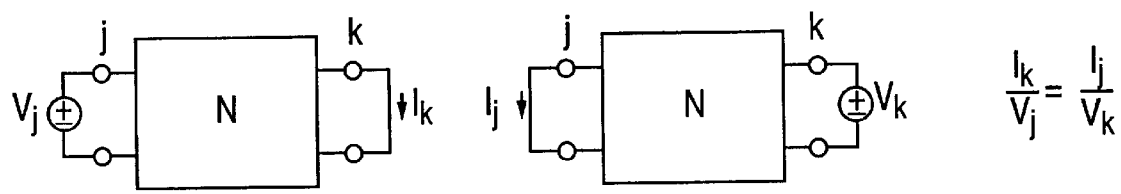
FIG. 4a is block diagrams for a short circuit (y-matrix) representation of the reciprocity theorem according to an example embodiment of the present invention.

FIG. 4a shows block diagrams for a short circuit (y-matrix) representation of the reciprocity theorem according to an example embodiment of the present invention.

Figure 4B:
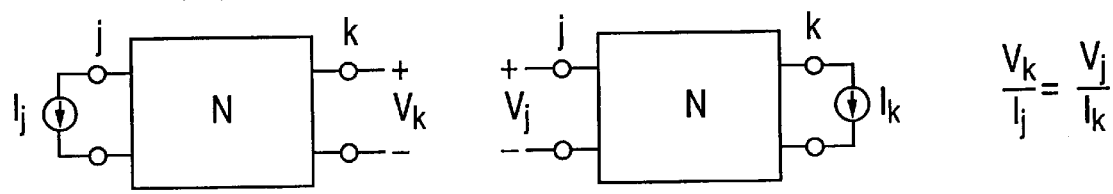
FIG. 4b is block diagrams for an open circuit (z-matrix) representation of the reciprocity theorem according to an example embodiment of the present invention.

FIG. 4b shows block diagrams for an open circuit (z-matrix) representation of the reciprocity theorem according to an example embodiment of the present invention. Regarding FIG. 4a, $I_k/V=I_j/V_k$. Moreover, regarding FIG. 4b, $V_k/I_j=V_j/I_k$.

Figure 5A:
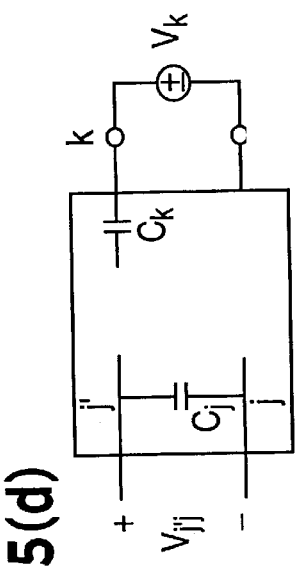
FIGS. 5a–d are block diagrams of the application of the reciprocity theorem for efficient transfer function computation according to an example embodiment of the present invention.

FIGS. 5a–d show block diagrams of the application of the reciprocity theorem for efficient transfer function computation according to an example embodiment of the present invention. The diagrams in FIGS. 5a–d are representations of the circuit shown in FIG. 3 without some intervening circuitry. FIG. 5a shows a representation of the original circuit, FIG. 5b the original circuit inserting a short circuited port at node k, and FIGS. 5c and 5d the application of reciprocity to the circuits. The following analysis shows the derivation of the transfer function. The transfer function of interest is $$H_{k'j}(s) = \frac{V_{k'k}(s)}{V_j(s)} \quad (1)$$

Since for capacitor $C_k$ $$V_{k'k}(t) = V_{C_k}(t) = \frac{1}{C_k} \int I_{C_k}(t) dt \quad (2)$$

or in the frequency domain (where integration corresponds to division by (s)):

$$V_{k'k}(s) = V_{C_k}(s) = \frac{1}{C_k} \frac{I_{C_k}(s)}{s} \quad (3)$$

from Equation (1) we have, $$H_{k'j}(s) = \frac{1}{V_j(s)} \frac{1}{C_k} \frac{I_{C_k}(s)}{s} \quad (4)$$

The reciprocity theorem is now applied to transfer function generation. The one-port circuit of FIG. 5a is converted to the two-port circuit of FIG. 5b by introducing a short-circuited port at node k. Since this port is short-circuited, the circuit of FIG. 5b is identical to that of FIG. 5a.

Figure 5B:
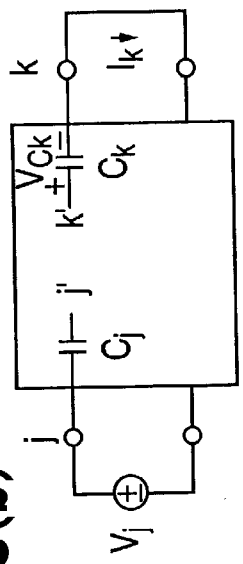
Figure 5C:
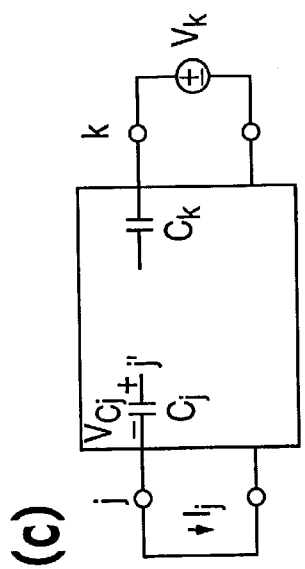

The circuit of FIG. 5b is compared to that of FIG. 5c where a voltage source has been applied at port k, and port j is short-circuited. Using the reciprocity theorem the following relationship applies:

$$\frac{I_k(s)}{V_j(s)} = \frac{I_j(s)}{V_k(s)} \quad (5)$$

Hence we have $$I_k(s) = I_{C_k}(s) = \frac{I_j(s)}{V_k(s)} V_j(s) \quad (6)$$

Substituting in Eq. 4 and recognizing that $I_{cj}(s)=I_j(s)$, we have, $$H_{k'j}(s) = \frac{1}{V_j(s)} \frac{1}{C_k} \frac{1}{s} \left( \frac{I_{C_j}(s)}{V_k(s)} V_j(s) \right), \quad (7)$$

$$= \frac{1}{C_k} \frac{1}{s} \left( \frac{I_{C_j}(s)}{V_k(s)} \right),$$

-continued $$= \frac{C_j}{C_k} \frac{1}{V_k(s)} \left( \frac{1}{C_j} \frac{Ic_j(s)}{s} \right),$$

$$= \frac{C_j}{C_k} \frac{V_{C_j}(s)}{V_k(s)}$$

Figure 5D:
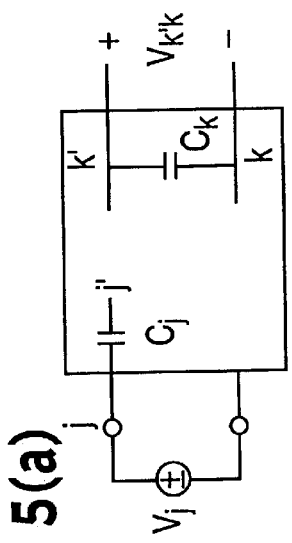

If the two-port circuit of FIG. 5c is converted to the single-port circuit of FIG. 5d, since $V_{jj}(s) = V_{cj}(s)$, this results in $$H_{k'j}(s) = \frac{C_j}{C_k} \frac{V_{j'j}(s)}{V_k(s)} = \frac{C_j}{C_k} H_{j'k}(s) \qquad (8)$$

A result of Eq. 8 shows that the transfer function for the circuit of FIG. 5a may be calculated by inserting a voltage source in series with a receiver capacitor $C_k$, shorting the original voltage source, and computing the transfer function at node j' of capacitor $C_j$ with respect to the newly inserted voltage source. The computed transfer function $H_{jk}$ (s) relates to the transfer function of interest $H_{kj}$ (s) by the ratio of the capacitors.

Figure 6:
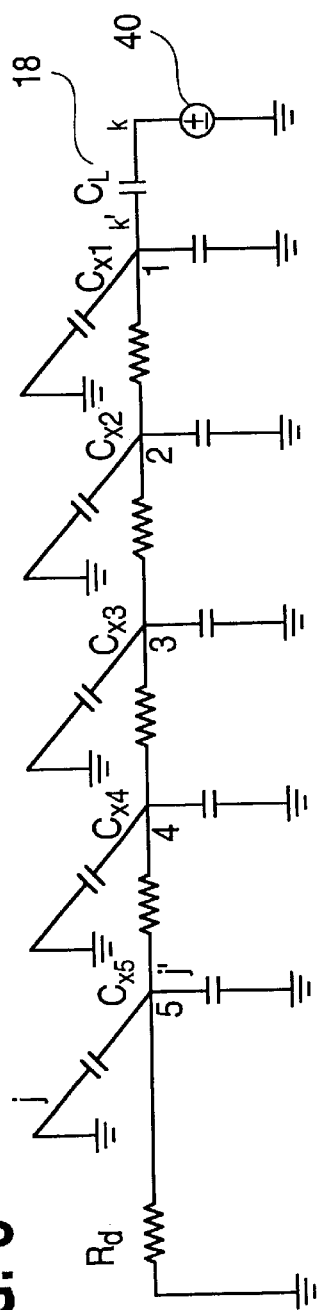
FIG. 6 is a schematic diagram of a circuit for noise computation based on reciprocity according to an example embodiment of the present invention.

FIG. 6 shows a schematic diagram of a circuit for noise computation based on reciprocity according to an example embodiment of the present invention. In this circuit, a voltage source 40 is connected in series with the receiver capacitor. All attacker capacitors representing adjacent nets have been shorted to ground.

Figure 7:
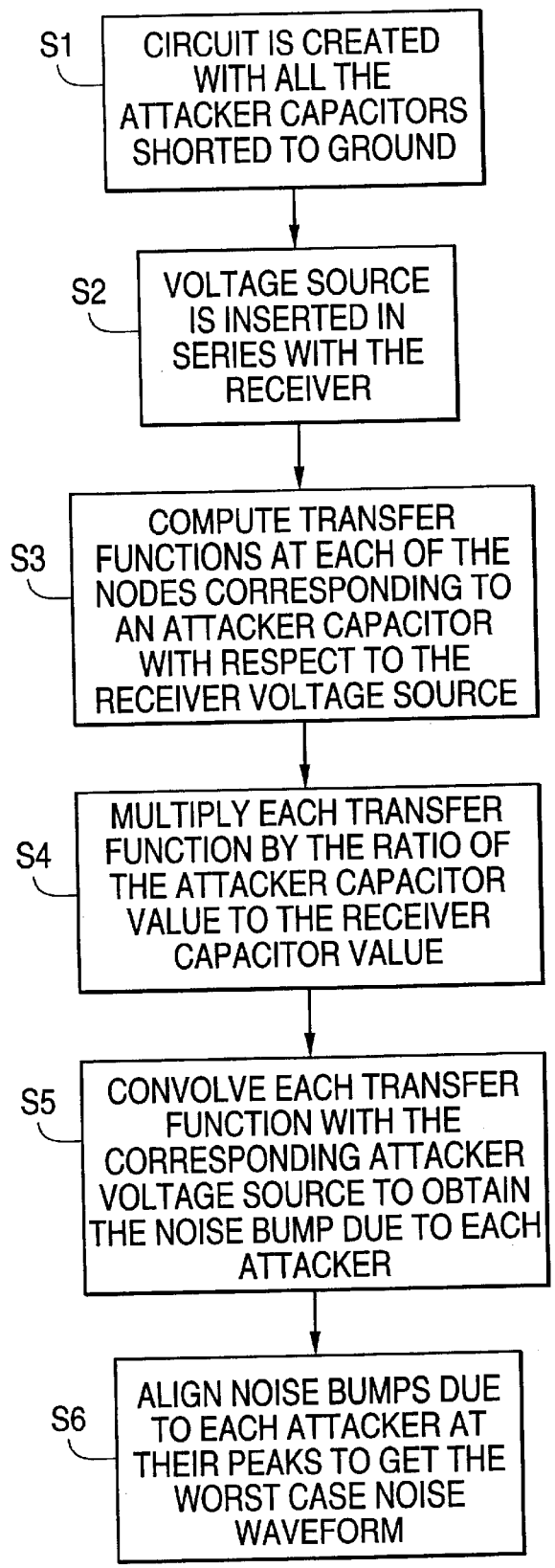
FIG. 7 is a flowchart of an example process for noise computation according to an example embodiment of the present invention.

FIG. 7 shows a flowchart of an example process for noise computation according to an example embodiment of the present invention. A circuit is created with all the attacker capacitors shorted to ground S1. A voltage source is inserted in series with the receiver S2. The transfer functions at each of the nodes corresponding to an attacker capacitor is computed with respect to the receiver voltage source in a single frequency domain analysis S3. Each transfer function is multiplied by the ratio of the attacker capacitor value to the receiver capacitor value S4. This provides the value of the transfer function from the attacker capacitor to the receiver based on the theory previously described. Each transfer function is convolved with the corresponding attacker voltage source to obtain the noise bump due to each attacker S5. The noise bumps due to each attacker are aligned at their peaks to get the worst case noise waveform S6.

Therefore, in method and apparatus according to the present invention, only a single frequency domain analysis is required for the circuit to calculate the transfer functions for all attacker capacitors. This is advantageous in that the time consuming process of analyzing the resulting circuit to determine the noise signal at the receiver for each capacitor is avoided. The method according to the present invention may be applied to every receiver in the net.

It is noted that the foregoing examples have been provided merely for the purpose of explanation and are in no way to be construed as limiting of the present invention. While the present invention has been described with reference to a preferred embodiment, it is understood that the words which have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A method for frequency domain noise analysis comprising:
   creating a noise modeling circuit of a net, the net having at least one receiver at one end of the net;
   shorting all capacitors representing adjacent nets in the circuit to ground;
   inserting a voltage source in series with each at least one receiver;
   setting each voltage source to zero except one, the one voltage source being in series with a target receiver of the at least one receiver;
   computing a transfer function between each capacitor representing an adjacent net and the voltage source of the target receiver;
   multiplying each associated transfer function by a ratio of a value of the capacitor representing the adjacent net to a capacitance value of the target receiver; and
   combining the results of each multiplication producing a determination of noise at the target receiver from all adjacent nets.

2. The method according to claim 1, further comprising computing the transfer function using a frequency-domain analyzer.

3. The method according to claim 2, further comprising computing the transfer function using a circuit analyzer based on Asymptotic Waveform Evaluation (AWE).

4. The method according to claim 3, further comprising computing the transfer function using Rapid Interconnect Circuit Analyzer (RICE).

5. The method according to claim 1, further comprising performing the setting computing multiplying and combining for every at least one receiver to obtain a determination of noise at each at least one receiver from all adjacent nets.

6. The method according to claim 2, further comprising using the reciprocity theorem for the computing and multiplying.

7. An apparatus comprising a storage medium with instructions stored therein, the instructions when executed causing a computing device to perform:
   creating a noise modeling circuit of a net, the net having at least one receiver at one end of the net;
   shorting all capacitors representing adjacent nets in the circuit to ground;
   inserting a voltage source in series with each at least one receiver;
   setting each voltage source to zero except one, the one voltage source being in series with a target receiver of the at least one receiver;
   computing a transfer function between each capacitor representing an adjacent net and the voltage source of the target receiver;
   multiplying each associated transfer function by a ratio of a value of the capacitor representing the adjacent net to a capacitance value of the target receiver; and
   combining the results of each multiplication producing a determination of noise at the target receiver from all adjacent nets.

8. The apparatus according to claim 7, the computing device further performing computing the transfer function using frequency-domain analysis.

9. The method according to claim 7, further comprising computing the transfer function using a circuit analyzer based on Asymptotic Waveform Evaluation (AWE).

10. The apparatus according to claim 9, the computing device further performing computing the transfer function using Rapid Interconnect Circuit Analyzer (RICE).

11. The apparatus according to claim 7, the computing device further performing the setting computing multiplying and combining for every at least one receiver to obtain a determination of noise at each at least one receiver from all adjacent nets.

12. The apparatus according to claim 7, the computing device further performing using the reciprocity theorem for the computing and multiplying.

13. A circuit for frequency-domain noise analysis comprising:
 a driver at a first end of a net, the driver represented by a zero-valued voltage source in series with a driver resistor;
 a plurality of resistor and capacitor pairs, each resistor in a pair connected to the capacitor in the pair at a node, the other end of the capacitor in the pair being connected to ground, the other end of the resistor in the pair being connected to a node of an adjacent resistor and capacitor pair;
 a receiver at a second end of the net, the receiver represented by a second voltage source in series with a load capacitor, the other end of the load capacitor being connected to the node of a resistor and capacitor pair closest to the second end of the net; and
 at least one second capacitor, one end of each at least one second capacitor being connected to a node, the other end of each at least one second capacitor being connected to ground,
 wherein noise at the load capacitor from all the at least one second capacitor is determined by shorting each at least one second capacitor, computing a transfer function between each at least one second capacitor and the second voltage source, multiplying each associated transfer function by a ratio of the at least one second capacitor capacitance to the load capacitor capacitance, and combining the results of each multiplication.

14. The circuit according to claim 13, further comprising computing the transfer function using a frequency-domain analyzer.

15. The method according to claim 13, further comprising computing the transfer function using a circuit analyzer based on Asymptotic Waveform Evaluation (AWE).

16. The circuit according to claim 15, further comprising computing the transfer function using Rapid Interconnect Circuit Analyzer (RICE).

17. The circuit according to claim 13, further comprising at least one additional receiver at the second end of the net.

18. The circuit according to claim 17, further comprising determining the noise at each load capacitor for each additional receiver from all the at least one second capacitor.

* * * * *